(12) United States Patent
Li et al.

(10) Patent No.: US 12,320,849 B2
(45) Date of Patent: Jun. 3, 2025

(54) CLOCK CONTROL CIRCUIT AND METHOD

(71) Applicant: Realtek Semiconductor Corporation, Hsinchu (TW)

(72) Inventors: Yu-Ting Li, Hsinchu (TW); Pei-Ying Hsueh, Hsinchu (TW); Ying-Yen Chen, Hsinchu (TW)

(73) Assignee: Realtek Semiconductor Corporation, Hsinchu (TW)

( * ) Notice: Subject to any disclaimer, the term of this patent is extended or adjusted under 35 U.S.C. 154(b) by 16 days.

(21) Appl. No.: 18/415,672

(22) Filed: Jan. 18, 2024

(65) Prior Publication Data

US 2025/0035702 A1   Jan. 30, 2025

(30) Foreign Application Priority Data

Jul. 27, 2023   (TW) .................................. 112128199

(51) Int. Cl.
*G01R 31/3177* (2006.01)
*H03K 3/037* (2006.01)

(52) U.S. Cl.
CPC ......... *G01R 31/3177* (2013.01); *H03K 3/037* (2013.01)

(58) Field of Classification Search
CPC ........ G01R 31/3177; G01R 31/318552; G01R 31/318594; H03K 3/037
See application file for complete search history.

(56) References Cited

U.S. PATENT DOCUMENTS 9,835,683 B2 *  12/2017  Khandelwal ....... G01R 31/3177

* cited by examiner

*Primary Examiner* — Thien Nguyen
(74) *Attorney, Agent, or Firm* — CKC & Partners Co., LLC

(57) ABSTRACT

The present disclosure provides a clock control circuit and method for a circuitry. The circuitry includes a scan flip-flop circuit, an at-speed domain and a timing exception domain. The scan flip-flop circuit is configured to output data to the at-speed domain and the timing exception domain. The clock control circuit includes a first gate control circuit, a first gate circuit, a second gate control circuit and a second gate circuit. The first gate circuit is controlled by a first control signal output by the first gate control circuit, a scan enable signal and a scan mode signal to block or output a clock signal to the scan flip-flop circuit. The second gate circuit is controlled by a second control signal output by the second gate control circuit to block or output an output signal of the scan flip-flop circuit to the timing exception domain.

20 Claims, 8 Drawing Sheets

CLOCK CONTROL CIRCUIT AND METHOD

CROSS-REFERENCE TO RELATED APPLICATION

This application claims priority to Taiwan Application Serial Number 112128199, filed Jul. 27, 2023, which is herein incorporated by reference in its entirety.

BACKGROUND

Field of Invention

This disclosure relates to a clock control circuit and method, and in particular to a clock control circuit and method of scan flip-flop circuits.

Description of Related Art

In existed technologies of scan chain test, a circuit under test often generates unknown data values due to some timing exception paths (e.g., a false path, a multicycle path, etc.), so that the amount of test pattern required by the circuit under test is increased under a transition delay fault. The increase in the amount of test pattern further leads to the increases in the test time and cost of the circuit under test. Therefore, it is necessary to solve these problems.

SUMMARY

An aspect of present disclosure relates to a clock control circuit. The clock control circuit is configured to control a circuitry, wherein the circuitry includes a scan flip-flop circuit, an at-speed domain and a timing exception domain, and the scan flip-flop circuit is configured to output data to the at-speed domain and the timing exception domain. The clock control circuit includes a first gate control circuit, a first gate circuit, a second gate control circuit and a second gate circuit. The first gate control circuit is configured to output a first control signal. The first gate circuit is coupled between the first gate control circuit and the scan flip-flop circuit, and is configured to be controlled by the first control signal, a scan enable signal and a scan mode signal to block or output a clock signal to the scan flip-flop circuit. The second gate control circuit is coupled to the first gate control circuit, and is configured to be controlled by the first control signal, the scan mode signal and a test switch signal to determine a second control signal. The second gate circuit is coupled to the scan flip-flop circuit, the second gate control circuit and the timing exception domain, is configured to receive the second control signal and an output signal of the scan flip-flop circuit, and is configured to be controlled by the second control signal to block or output the output signal to the timing exception domain.

Another aspect of present disclosure relates to a clock control method of a circuitry. The circuitry includes a scan flip-flop circuit, an at-speed domain and a timing exception domain, and the scan flip-flop circuit is configured to output data to the at-speed domain and the timing exception domain. The clock control method includes: when the circuitry is operated in a capture phase of a scan test, by a first gate circuit coupled to a clock input terminal of the scan flip-flop circuit, providing a clock signal to the scan flip-flop circuit according to a first control signal having a first logic value; and when the circuitry is operated in the capture phase, by the first gate circuit, blocking the clock signal to the scan flip-flop circuit according to the first control signal having a second logic value different to the first logic value, wherein the logic value of the first control signal is determined by a test pattern for testing the circuitry.

In sum, by the clock control circuit of the present disclosure, the at-speed domain in the circuitry can avoid receiving the unknown data values under the transition delay fault test. In such way, the amount of the test pattern for the circuitry and the test time and cost of the circuitry can all be dramatically reduced. In addition, the clock control circuit of the present disclosure can also avoid affecting the operation of the circuitry when the circuitry is operated under the stuck-at fault test or operated in the function mode.

DETAILED DESCRIPTION

The embodiments are described in detail below with reference to the appended drawings to better understand the aspects of the present disclosure. However, the provided embodiments are not intended to limit the scope of the disclosure, and the description of the structural operation is not intended to limit the order in which they are performed. Any device that has been recombined by components and produces an equivalent function is within the scope covered by the disclosure.

The terms used in the entire specification and the scope of the patent application, unless otherwise specified, generally have the ordinary meaning of each term used in the field, the content disclosed herein, and the particular content.

The terms "coupled" or "connected" as used herein may mean that two or more elements are directly in physical or electrical contact, or are indirectly in physical or electrical contact with each other. It can also mean that two or more elements interact with each other.

Figure 1:
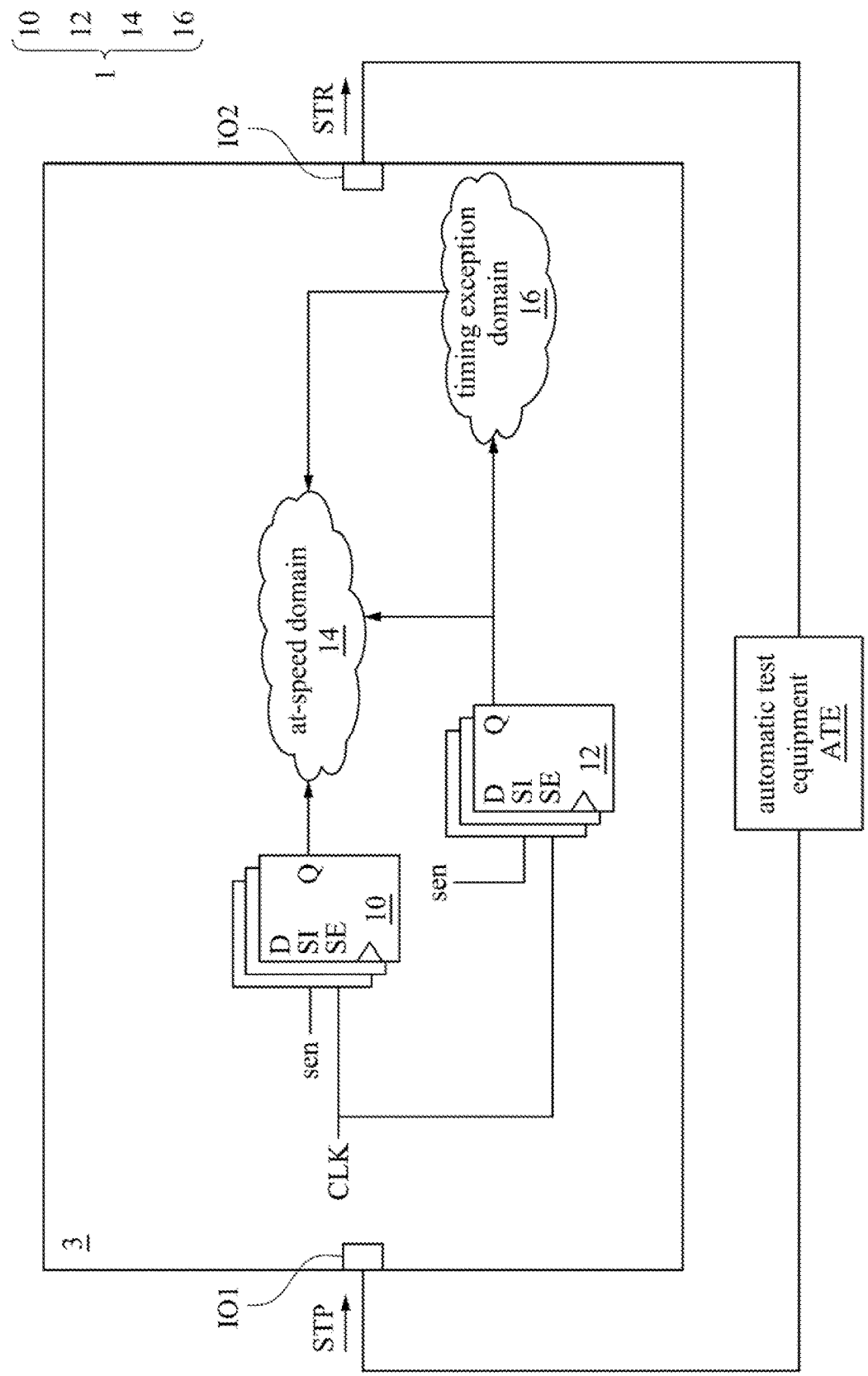
FIG. 1 is a simplified block diagram of a circuitry in accordance with some related arts.

Referring to FIG. 1, FIG. 1 is a simplified block diagram of a circuitry 1 in accordance with some related arts. As shown in FIG. 1, the circuitry 1 includes a scan flip-flop circuit 10, a scan flip-flop circuit 12, an at-speed domain 14 and a timing exception domain 16. The circuitry 1 can be arranged on a chip 3, and an automatic test equipment ATE can test the circuitry 1 through the chip 3. In particular, the at-speed domain 14 and the timing exception domain 16 are each a combinational logic circuit composed of various logic gates, and the scan flip-flop circuit 10 and the scan flip-flop circuit 12 are each a sequential logic circuit different from the combinational logic circuit. It should be understood that the amount of the scan flip-flop circuit 10 can be one or more, and that the amount of the scan flip-flop circuit 12 can also be one or more.

In some related arts of FIG. 1, the scan flip-flop circuit 10 and the scan flip-flop circuit 12 each has a first data input terminal D, a second data input terminal SI, an input enable terminal SE and a data output terminal Q, in which the input enable terminal SE is configured to receive a scan enable signal sen. In addition, the scan flip-flop circuit 10 and the scan flip-flop circuit 12 are each configured to receive a clock signal CLK via a clock input terminal. Accordingly, the scan flip-flop circuit 10 and the scan flip-flop circuit 12 are each configured to temporarily store data received by the first data input terminal D or the second data input terminal SI according to the scan enable signal sen and the clock signal CLK. For example, the scan flip-flop circuit 10 and the scan flip-flop circuit 12 each temporarily stores the data received by the second data input terminal SI in response to a triggering of at least one pulse in the clock signal CLK when the scan enable signal sen has a first logic value (e.g., logic 1). For another example, the scan flip-flop circuit 10 and the scan flip-flop circuit 12 each temporarily stores the data received by the first data input terminal D in response to the triggering of the at least one pulse in the clock signal CLK when the scan enable signal sen has a second logic value (e.g., logic 0).

In accordance with the above descriptions, the data output terminal Q of the scan flip-flop circuit 10 is coupled to the at-speed domain 14, to output the temporarily stored data to the at-speed domain 14. The data output terminal Q of the scan flip-flop circuit 12 is coupled to the at-speed domain 14 and the timing exception domain 16, to output the temporarily stored data to the at-speed domain 14 and the timing exception domain 16. The timing exception domain 16 receives the data output by the scan flip-flop circuit 12, so as to generate data to the at-speed domain 14. Also, the at-speed domain 14 receives the data output by the scan flip-flop circuit 10, the data output by the scan flip-flop circuit 12 and the data output by the timing exception domain 16, so as to generate data.

It should be understood that the connection structure of the circuitry 1 as shown in FIG. 1 is illustrated for the purpose of descriptions, but is not limited herein. For example, the first data input terminal D is usually coupled to data output terminal of at least one combinational logic circuit in the circuitry 1. The second data input terminal SI is usually coupled to data output terminal of at least one scan flip-flop circuit in the circuitry 1. The data output terminal Q is usually coupled to data input terminal of the at least one combinational logic circuit and/or second data input terminal of the at least one scan flip-flop circuit in the circuitry 1. Accordingly, multiple sequential logic circuits connected in series would form a scan chain path in the circuitry 1. In addition, data output terminal of the at-speed domain 14 can also be coupled to first data input terminal of the at least one scan flip-flop circuit in the circuitry 1.

As shown in FIG. 1 again, the automatic test equipment ATE is configured to generate a preset test pattern STP. In some related arts, the test pattern STP is configured to test the circuitry 1 and can be a data sequence. In particular, a preset amount of data values (e.g., logic 0, logic 1, etc.) are arranged to compose the test pattern STP, and the arrangement of the data values can be predetermined by the automatic test equipment ATE according to the test to be performed on the circuitry 1.

In some related arts, the automatic test equipment ATE can input the test pattern STP to the circuitry 1 via a scan input terminal 101 on the chip 3, to perform a scan test on the circuitry 1 via the scan chain path. Also, the automatic test equipment ATE can receive a test output STR output by the circuitry 1 via a scan output terminal 102 on the chip 3, to obtain an operational status of the circuitry 1. Generally, the execution of the scan test includes at least shift phase and capture phase, which is well known by person having ordinary skill in the arts of the present disclosure. Therefore, the shift phase and the capture phase would be simplistically described in the following paragraphs by using the structure of FIG. 1 as an example.

In the shift phase, the scan enable signal sen has the first logic value. In response to the triggering of the at least one pulse in the clock signal CLK, the scan flip-flop circuit 10 and the scan flip-flop circuit 12 each temporarily stores the data value received by the second data input terminal SI, and each outputs the previously and temporarily stored data value to the scan flip-flop circuit (not shown) coupled to the data output terminal Q, so as to serially transmit the multiple data values of the test pattern STP on the scan chain path. Before the shift phase is coming to end, the scan flip-flop circuit 10 and the scan flip-flop circuit 12 each would store one corresponding data value in the multiple data values of the test pattern STP.

In the capture phase, the scan enable signal sen has the second logic value. At the beginning, the timing exception domain 16 calculates according to the data value temporarily stored by the scan flip-flop circuit 12. Afterwards, in response to the triggering of the at least one pulse in the clock signal CLK, the scan flip-flop circuit (not shown) coupled to the data output terminal of the at-speed domain 14 temporarily stores the data value generated from the calculation of the at-speed domain 14. Also, the scan flip-flop circuit 10 and the scan flip-flop circuit 12 each temporarily stores the data value generated from the calculation of the combinational logic circuit (not shown) coupled to the first data input terminal D.

After the capture phase is ended, the circuitry 1 enters the shift phase again. The multiple data values generated from the calculations of the multiple combinational logic circuits of the circuitry 1 would be serially transmitted on the scan chain path, and are received by the automatic test equipment ATE eventually. In such way, the automatic test equipment ATE can obtain the operational status of the circuitry 1 according to the multiple data values (i.e., the test output STR) received by it. In the above scan test, the operations of other combinational and sequential logic circuits in the circuitry 1 can be deduced by analogy, and therefore will not be described herein.

In some related arts, the scan test generally can include a stuck-at fault test, a transition delay fault test, etc. In FIG. 1, the timing exception domain 16 is set to have a timing exception path such as a false path, a multicycle path, etc., so that unknown or unexpected data values may be generated due to the transition of the scan flip-flop circuit 12 (for example, changing from temporarily storing logic 0 to temporarily storing logic 1, changing from temporarily storing logic 1 to temporarily storing logic 0, etc.) under the transition delay fault test. Although the at-speed domain 14 does not have such problem, it may be affected because of receiving the unknown data values generated by the timing exception domain 16, which further leads to the increases in amount of the test pattern, test time and test cost.

Figure 2:
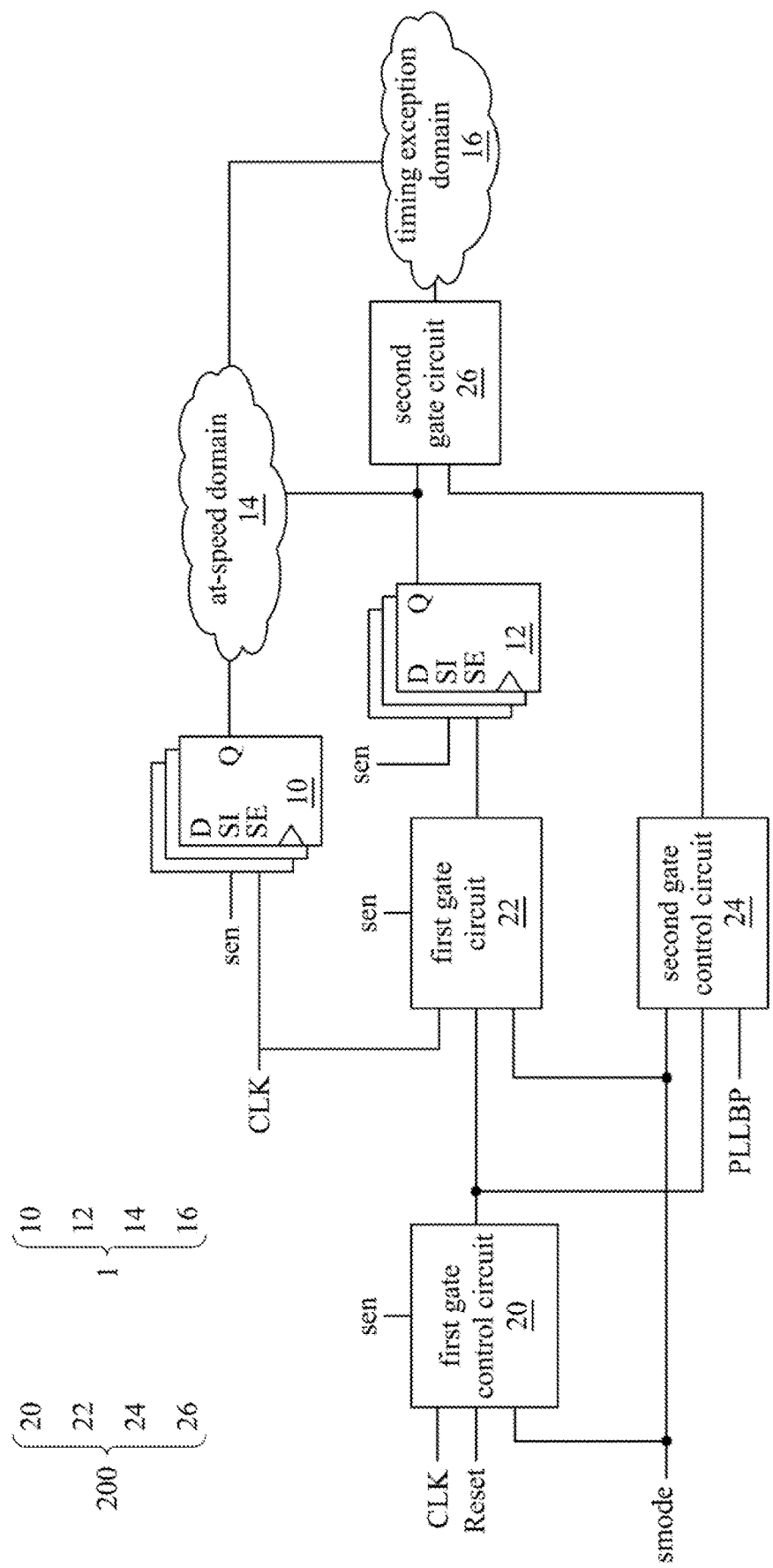
FIG. 2 is a block diagram of a clock control circuit which is applied to the circuitry of FIG. 1 in accordance with some embodiments of the present disclosure.

In view of this, the present disclosure provides a circuit which is capable of preventing the at-speed domain 14 from receiving the unknown data values in the transition delay fault test, which would be described in detail with reference to FIG. 2. Referring to FIG. 2, FIG. 2 is a block diagram of a clock control circuit 200 which is applied to the circuitry 1 of FIG. 1 in accordance with some embodiments of the present disclosure. In some embodiments, the clock control circuit 200 is configured to control the circuitry 1, and includes a first gate control circuit 20, a first gate circuit 22, a second gate control circuit 24 and a second gate circuit 26. In structure, the first gate circuit 22 is coupled between the first gate control circuit 20 and the clock input terminal of the scan flip-flop circuit 12. The second gate control circuit 24 is coupled to the first gate control circuit 20. In addition, the second gate circuit 26 is coupled to the second gate control circuit 24, the data output terminal Q of the scan flip-flop circuit 12, the at-speed domain 14 and the timing exception domain 16.

As shown in FIG. 2, the first gate control circuit 20 is configured to receive the clock signal CLK, the scan enable signal sen, a scan mode signal smode and a reset signal Reset. The first gate circuit 22 is configured to receive the clock signal CLK, the scan enable signal sen and the scan mode signal smode. The second gate control circuit 24 is configured to receive the scan mode signal smode and a test switch signal PLLBP.

In some embodiments, the scan mode signal smode is configured to control the circuitry 1 whether or not to execute the scan test. For example, when the scan mode signal smode has the first logic value, the circuitry 1 would execute the scan test. When the scan mode signal smode has the second logic value, the circuitry 1 would not execute the scan test (for example, the circuitry 1 can be operated in a function mode). The scan enable signal sen is configured to control the circuitry 1 to operate in the shift phase or the capture phase of the scan test, which can refer to the above descriptions of the shift phase and the capture phase and would not be described repeatedly herein. Also, the test switch signal PLLBP is configured to control the type of the scan test. For example, when the test switch signal PLLBP has the first logic value, the type of the scan test is the stuck-at fault test. When the test switch signal PLLBP has the second logic value, the type of the scan test is the transition delay fault test.

Figure 3:
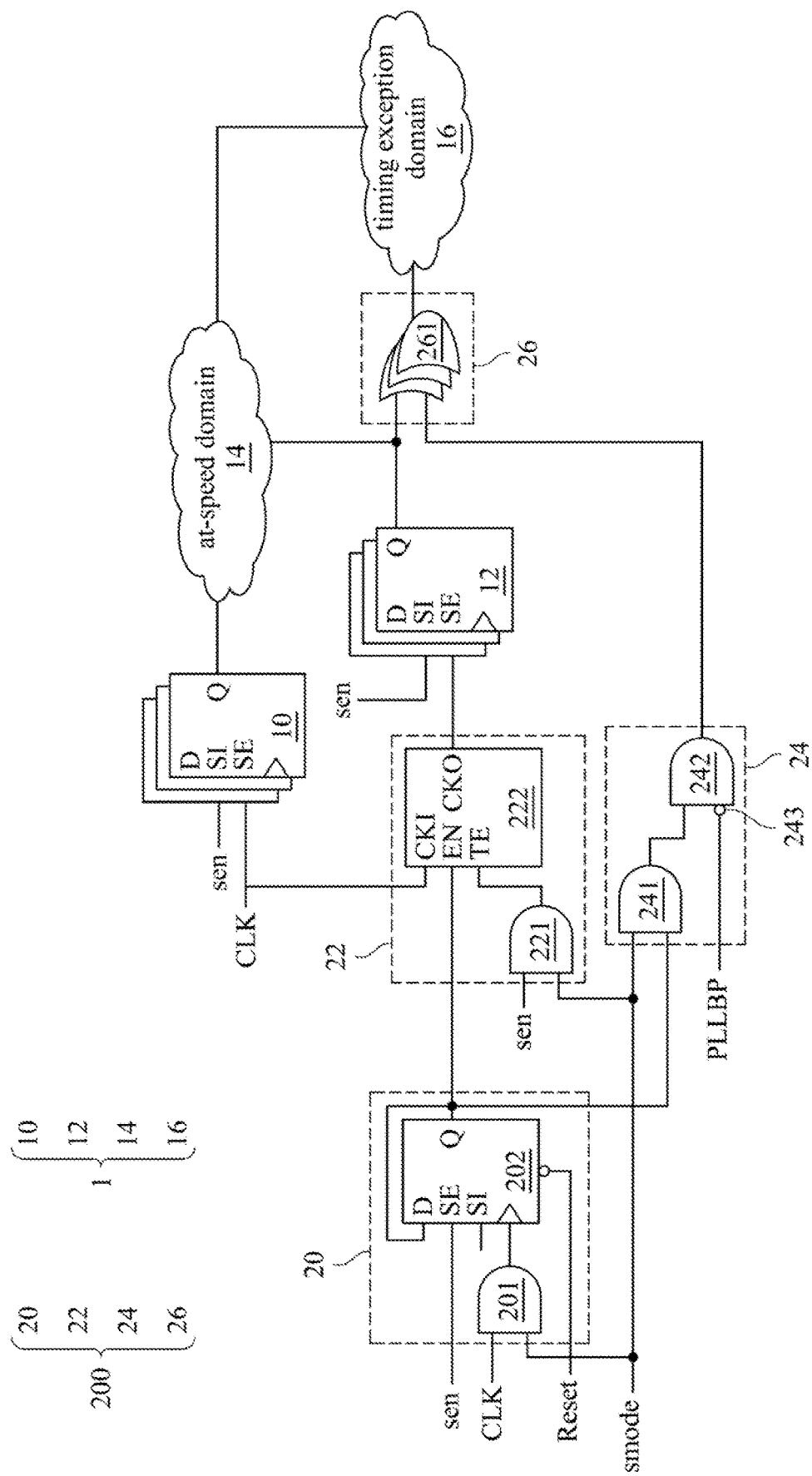
FIG. 3 is a schematic diagram of the clock control circuit in accordance with some embodiments of the present disclosure.

Referring to FIG. 3, FIG. 3 is a schematic diagram of the clock control circuit 200 in accordance with some embodiments of the present disclosure. The elements in FIG. 3 which are the same or similar to those in FIG. 1 are represented with the same symbols, and would not be described repeatedly herein.

In the embodiments of FIG. 3, the first gate control circuit 20 includes a logic circuit 201 and a switch control circuit 202. A first input terminal of the logic circuit 201 is configured to receive the clock signal CLK, and a second input terminal of the logic circuit 201 is configured to receive the scan mode signal smode. An output terminal of the logic circuit 201 is coupled to the clock input terminal of the switch control circuit 202. The input enable terminal SE of the switch control circuit 202 is configured to receive the scan enable signal sen. The data output terminal Q of the switch control circuit 202 is coupled to the first data input terminal D of the switch control circuit 202, the first gate circuit 22 and the second gate control circuit 24. In addition, the switch control circuit 202 is configured to receive the reset signal Reset.

In particular, as shown in FIG. 3, the logic circuit 201 can be implemented by an AND gate, and the switch control circuit 202 can be implemented by the scan flip-flop circuit. Therefore, although the connection of the second data input terminal SI of the switch control circuit 202 is not illustrated in FIG. 3, it should be understood that the second data input terminal SI of the switch control circuit 202 can be coupled to the data output terminal of the at least one scan flip-flop circuit in the circuitry 1. That is to say, the second data input terminal SI of the switch control circuit 202 can be coupled to the scan chain path including the scan flip-flop circuit 10, the scan flip-flop circuit 12 and other scan flip-flop circuits which are not illustrated.

In the embodiments of FIG. 3, the first gate circuit 22 includes a logic circuit 221 and a switch circuit 222. A first input terminal of the logic circuit 221 is configured to receive the scan enable signal sen, and a second input terminal of the logic circuit 221 is configured to receive the scan mode signal smode. A main enable terminal TE of the switch circuit 222 is coupled to an output terminal of the logic circuit 221. A minor enable terminal EN of the switch circuit 222 is coupled to the data output terminal Q of the switch control circuit 202. A clock input terminal CKI of the switch circuit 222 is configured to receive the clock signal CLK. A clock output terminal CKO of the switch circuit 222 is coupled to the clock input terminal of the scan flip-flop circuit 12. In particular, the logic 221 can be implemented by an AND gate, and the switch circuit 222 can be implemented by an integrated clock gating (ICG) circuit.

In the embodiments of FIG. 3, the second gate control circuit 24 includes a logic circuit 241, a logic circuit 242 and a logic circuit 243. A first input terminal of the logic circuit 241 is configured to receive the scan mode signal smode, and a second input terminal of the logic circuit 241 is coupled to the data output terminal Q of the switch control circuit 202. A first input terminal of the logic circuit 242 is coupled to an output terminal of the logic circuit 241, and an output terminal of the logic circuit 242 is coupled to the second gate circuit 26. An input terminal of the logic circuit 243 is configured to receive the test switch signal PLLBP, and an output terminal of the logic circuit 243 is coupled to a second input terminal of the logic circuit 242. In particular, the logic circuit 241 and the logic circuit 242 each can be implemented by an AND gate, and the logic circuit 243 can be implemented by a NOT gate.

In the embodiments of FIG. 3, the second gate circuit 26 includes a logic circuit 261. A first input terminal of the logic circuit 261 is coupled to the data output terminal Q of the scan flip-flop circuit 12 and the at-speed domain 14, a second input terminal of the logic circuit 261 is coupled to the output terminal of the logic circuit 242 in the second gate control circuit 24, and an output terminal of the logic circuit 261 is coupled to the timing exception domain 16. In particular, the logic circuit 261 can be implemented by an OR gate. It should be understood that the amount of the logic circuit 261 can be one or more.

Figure 4:
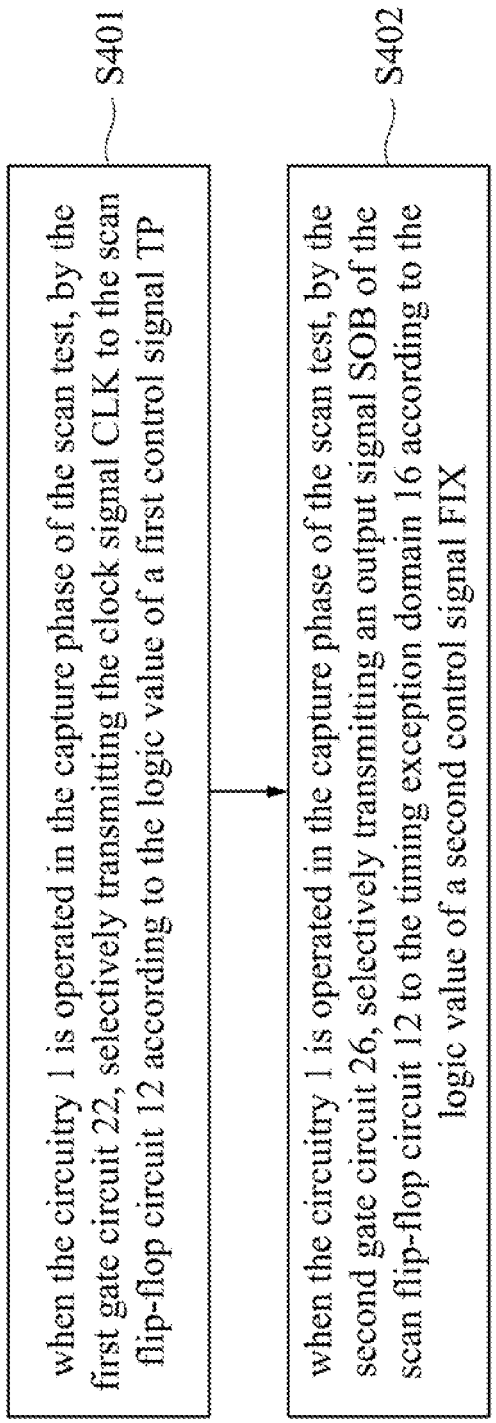
FIG. 4 is a flow diagram of a clock control method in accordance with some embodiments of the present disclosure.

The operation of the clock control circuit 200 under the transition delay fault test would be then described in detail with reference to a clock control method 400 as shown in FIG. 4. Referring to FIG. 4, FIG. 4 is a flow diagram of the clock control method 400 in accordance with some embodiments of the present disclosure. In some embodiments, the clock control method 400 can be executed by the clock control circuit 200. As shown in FIG. 4, the clock control method 400 includes steps S401-S402.

In step S401, when the circuitry 1 is operated in the capture phase of the scan test, the first gate circuit 22 selectively transmits the clock signal CLK to the scan flip-flop circuit 12 according to the logic value of a first control signal TP.

In step S402, when the circuitry 1 is operated in the capture phase of the scan test, the second gate circuit 26 selectively transmits an output signal SOB of the scan flip-flop circuit 12 to the timing exception domain 16 according to the logic value of a second control signal FIX.

Figure 5A:
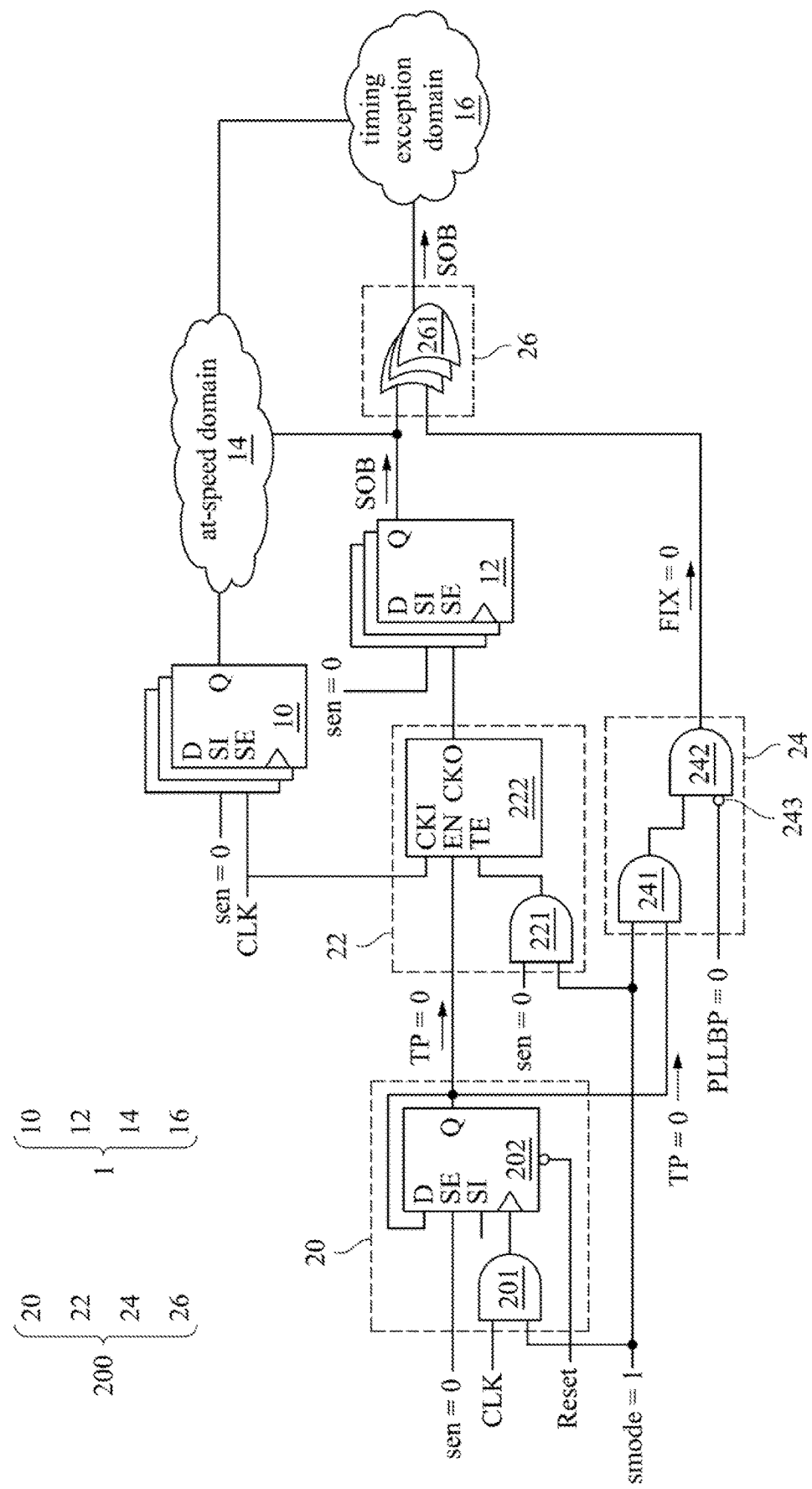
FIGS. 5A and 5B are schematic diagrams of an operation of the clock control circuit when the circuitry is operated in a capture phase under a transition delay fault test in accordance with some embodiments of the present disclosure.
Figure 5B:
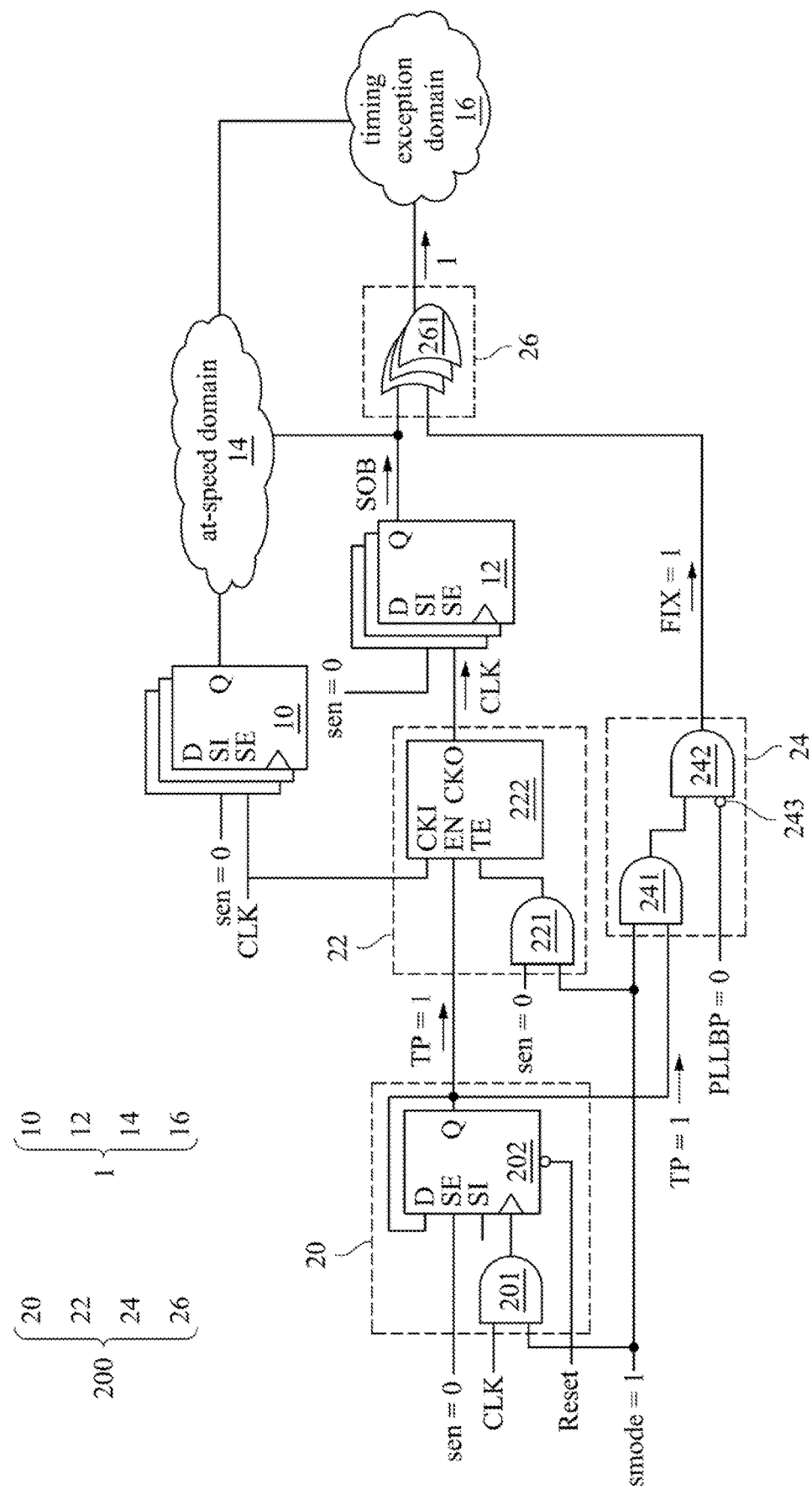

FIGS. 5A and 5B are schematic diagrams of the operation of the clock control circuit 200 when the circuitry 1 is operated in the capture phase under the transition delay fault test in accordance with some embodiments of the present disclosure. Steps S401-S402 would be described in detail herein by using the embodiments of FIG. 5A as an example.

Please see the first gate control circuit 20 in FIG. 5A. In some embodiments, the data value of the test pattern STP temporarily stored by the switch control circuit 202 after the shift phase is ended is preset to be logic 0. Accordingly, as shown in FIG. 5A, the switch control circuit 202 outputs the first control signal TP having the second logic value (e.g., logic 0) via the data output terminal Q in the capture phase. Also, because the first data input terminal D and the data output terminal Q of the switch control circuit 202 are coupled to each other, the switch control circuit 202, in the condition that the scan mode signal smode has the first logic value and that the scan enable signal sen has the second logic value, temporarily stores the data value of logic 0 received by the first data input terminal D according to the clock signal CLK output by the logic circuit 201, so as to output the first control signal TP having the second logic value via the data output terminal Q again.

Please see the first gate circuit 22 in FIG. 5A. The logic circuit 221 outputs an output logic value which is the second logic value according to the scan enable signal sen having the second logic value and the scan mode signal smode having the first logic value. The switch circuit 222, in the condition that the output logic value received by the main enable terminal TE is the second logic value (e.g., logic 0), blocks the clock signal CLK to the clock input terminal of the scan flip-flop circuit 12 according to the first control signal TP having the second logic value received by the minor enable terminal EN.

Please see the second gate control circuit 24 in FIG. 5A. The logic circuit 241 outputs the second logic value (e.g., logic 0) to the logic circuit 242 according to the scan mode signal smode having the first logic value and the first control signal TP having the second logic value. The logic circuit 243 outputs the first logic value (e.g., logic 1) to the logic circuit 242 according to the test switch signal PLLBP having the second logic value. Accordingly, the logic circuit 242 outputs the second control signal FIX having the second logic value.

Please see the second gate circuit 26 in FIG. 5A. Since the logic circuit 261 is implemented by the OR gate, the logic circuit 261 can be regarded as a short-circuited circuit in the condition that the second control signal FIX has the second logic value, which allows the output signal SOB of the scan flip-flop circuit 12 to be transmitted to the timing exception domain 16.

As can be seen from the descriptions of FIG. 5A, when the circuitry 1 is operated in the capture phase under the transition delay fault test, the first gate circuit 22 blocks the clock signal CLK to the scan flip-flop circuit 12 according to the first control signal TP having the second logic value (corresponding to step S401), and the second gate circuit 26 provides the output signal SOB of the scan flip-flop circuit 12 to the timing exception domain 16 according to the second control signal FIX having the second logic value (corresponding to step S402). In such way, the scan flip-flop circuit 12 would not be triggered by the clock signal CLK to operate, so that the transition of the scan flip-flop circuit 12 would not occur. Also, since the transition of the scan flip-flop circuit 12 would not occur, the data value transmitted from the scab flip-flop circuit 12 to the timing exception domain 16 by the second gate circuit 26 is fixed, so that the timing exception domain 16 would not generate the unknown data value to the at-speed domain 14.

Then, steps S401-S402 would be described in detail by using the embodiments of FIG. 5B as an example. Please see the first gate control circuit 20 in FIG. 5B. In some embodiments, the data value of the test pattern STP temporarily stored by the switch control circuit 202 after the shift phase is ended is preset to be logic 1. Accordingly, as shown in FIG. 5B, the switch control circuit 202 outputs the first control signal TP having the first logic value (e.g., logic 1) via the data output terminal Q in the capture phase. Also, because the first data input terminal D and the data output terminal Q of the switch control circuit 202 are coupled to each other, the switch control circuit 202, in the condition that the scan mode signal smode has the first logic value and that the scan enable signal sen has the second logic value, temporarily stores the data value of logic 1 received by the first data input terminal D according to the clock signal CLK output by the logic circuit 201, so as to output the first control signal TP having the first logic value via the data output terminal Q again.

Please see the first gate circuit 22 in FIG. 5B. The logic circuit 221 outputs an output logic value which is the second logic value according to the scan enable signal sen having the second logic value and the scan mode signal smode having the first logic value. The switch circuit 222, in the condition that the output logic value received by the main enable terminal TE is the second logic value (e.g., logic 0), provides the clock signal CLK to the clock input terminal of the scan flip-flop circuit 12 according to the first control signal TP having the first logic value received by the minor enable terminal EN.

Please see the second gate control circuit 24 in FIG. 5B. The logic circuit 241 outputs the first logic value (e.g., logic 1) to the logic circuit 242 according to the scan mode signal smode having the first logic value and the first control signal TP having the first logic value. The logic circuit 243 outputs the first logic value (e.g., logic 1) to the logic circuit 242 according to the test switch signal PLLBP having the second logic value. Accordingly, the logic circuit 242 outputs the second control signal FIX having the first logic value.

Please see the second gate circuit 26 in FIG. 5B. Since the logic circuit 261 is implemented by the OR gate, the logic circuit 261 would continuously output logic 1 to the timing exception domain 16 in the condition that the second control signal FIX has the first logic value. Logic 1 output by the logic circuit 261 can be referred to as a predetermined signal having the first logic value.

As can be seen from the descriptions of FIG. 5B, when the circuitry 1 is operated in the capture phase under the transition delay fault test, the first gate circuit 22 provides the clock signal CLK to the scan flip-flop circuit 12 according to the first control signal TP having the first logic value (corresponding to step S401), and the second gate circuit 26 blocks the output signal SOB of the scan flip-flop circuit 12 to the timing exception domain 16 according to the second control signal FIX having the first logic value (corresponding to step S402). That is to say, the scan flip-flop circuit 12 would be triggered by the clock signal CLK to operate, so that the transition of the scan flip-flop circuit 12 may occur. Nonetheless, since the second gate circuit 26 would provide the predetermined signal which continuously has the first logic value (e.g., logic 1) to the timing exception domain 16, the timing exception domain 16 would also not generate the unknown data value to the at-speed domain 14.

It can further be seen from the descriptions of FIGS. 5A and 5B that the first gate control circuit 20 is configured to output the first control signal TP, and that the logic value of the first control signal TP is determined by the test pattern STP. The first gate circuit 22 is configured to be controlled by the first control signal TP, the scan enable signal sen and the scan mode signal smode to block or output the clock signal CLK to the scan flip-flop circuit 12. The second gate control circuit 24 is configured to be controlled by the first control signal TP, the scan mode signal smode and the test switch signal PLLBP, to determine the second control signal FIX (for example, to determine the logic value of the second control signal FIX). Also, the second gate circuit 26 is configured to be controlled by the second control signal FIX, to block or output the output signal SOB of the scan flip-flop circuit 12 to the timing exception domain 16.

It should be understood that the clock control method 400 of the present disclosure is not limited to steps S401-S402 as shown in FIG. 4. For example, when the circuitry 1 is operated in the shift phase under the transition delay fault test, the logic circuit 221 outputs the output logic value which is the first logic value (e.g., logic 1) according to the scan enable signal sen having the first logic value and the scan mode signal smode having the first logic value. In the condition that the output logic value received by the main enable terminal TE is the first logic value, the switch circuit 222 would provide the clock signal CLK to the clock input terminal of the scan flip-flop circuit 12 regardless of whether the first control signal TP has the first or second logic value. In such way, the scan flip-flop circuit 12 can be set to one corresponding data value in the multiple data values of the test pattern STP. As can be seen from this, in some embodiments, the clock control method 400 can further include another step. In said another step, when the circuitry 1 is operated in the shift phase, the first gate circuit 22 would transmit the clock signal CLK to the scan flip-flop circuit 12.

Figure 6:
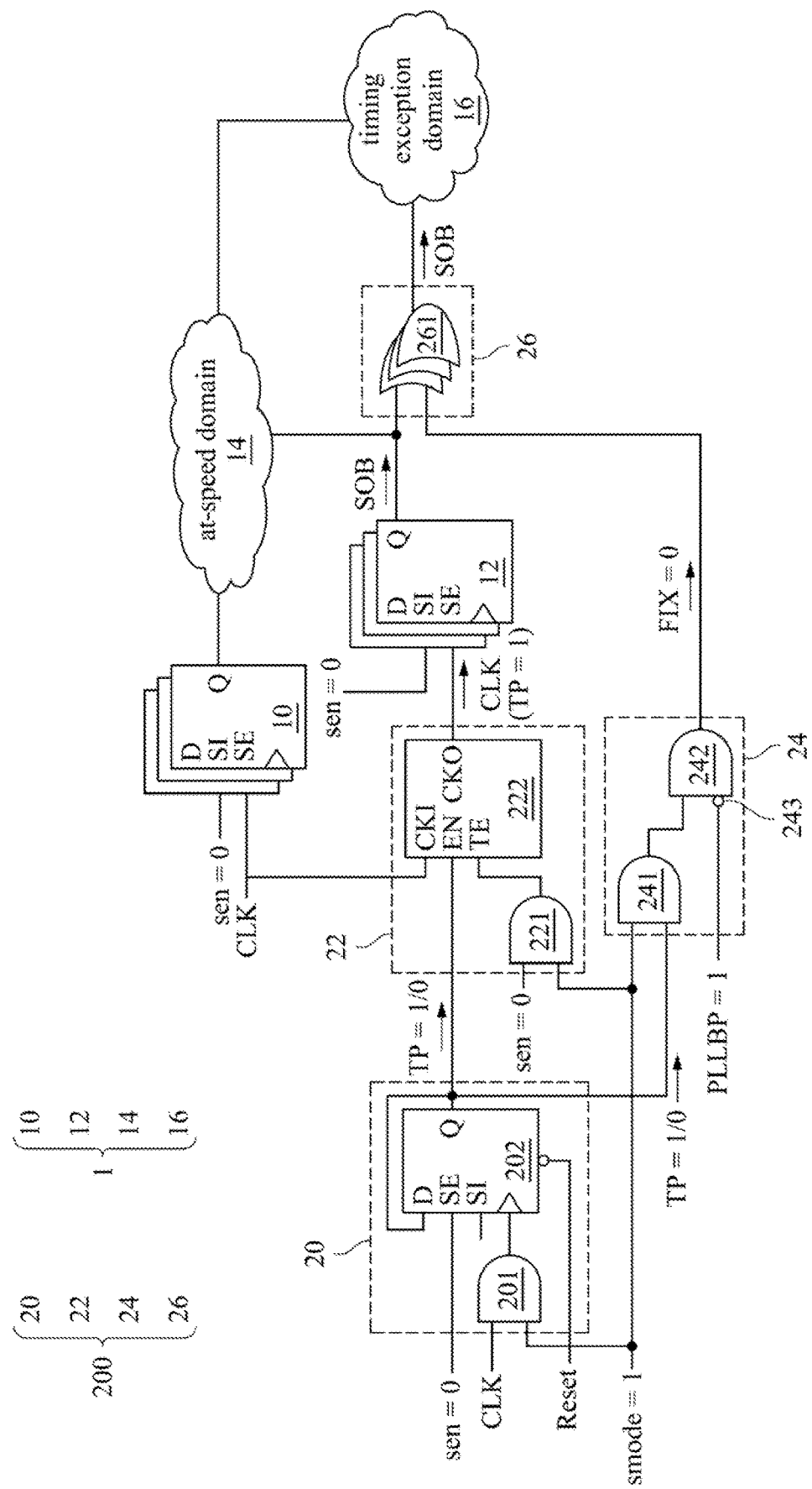
FIG. 6 is a schematic diagram of an operation of the clock control circuit when the circuitry is operated in a capture phase under a stuck-at fault test in accordance with some embodiments of the present disclosure.

In accordance with the above descriptions, referring to FIG. 6, FIG. 6 is a schematic diagram of an operation of the clock control circuit 200 when the circuitry 1 is operated in the capture phase under the stuck-at fault test in accordance with some embodiments of the present disclosure. In the embodiments of FIG. 6, the operations of the first gate control circuit 20 and the first gate circuit 22 are the same or similar to those of the embodiments of FIGS. 5A and 5B, and therefore are omitted herein.

Please see the second gate control circuit 24 in FIG. 6. The logic circuit 243 outputs the second logic value (e.g., logic 0) to the logic circuit 242 according to the test switch signal PLLBP having the first logic value. Accordingly, the logic circuit 242 would continuously output the second control signal FIX having the second logic value regardless of whether the logic circuit 241 outputs the first or second logic value. Please see the second gate circuit 26 in FIG. 6. Since the second gate control circuit 24 continuously outputs the second control signal FIX having the second logic value, the logic circuit 261 is continuously operated as the short-circuited circuit, so as to allow the output signal SOB of the scan flip-flop circuit 12 to be transmitted to the timing exception domain 16. In such way, the clock control circuit 200 would not affect the operation of the circuitry 1 under the stuck-at fault test.

As can be seen from the descriptions of FIG. 6, when the circuitry 1 is operated in the capture phase of the stuck-at fault test, the first gate circuit 22 selectively transmits the clock signal CLK to the scan flip-flop circuit 12 according to the logic value of the first control signal TP (corresponding to step S401), but the second gate circuit 26 continuously provides the output signal SOB of the scan flip-flop circuit 12 to the timing exception domain 16 because the second control signal FIX is maintained to have the second logic value. That is to say, in some embodiments, in another step after step S401, when the circuitry 1 is operated in the capture phase, the second gate circuit 26 provides the output signal SOB of the scan flip-flop circuit 12 to the timing exception domain 16 according to the second control signal FIX having the second logic value.

Figure 7:
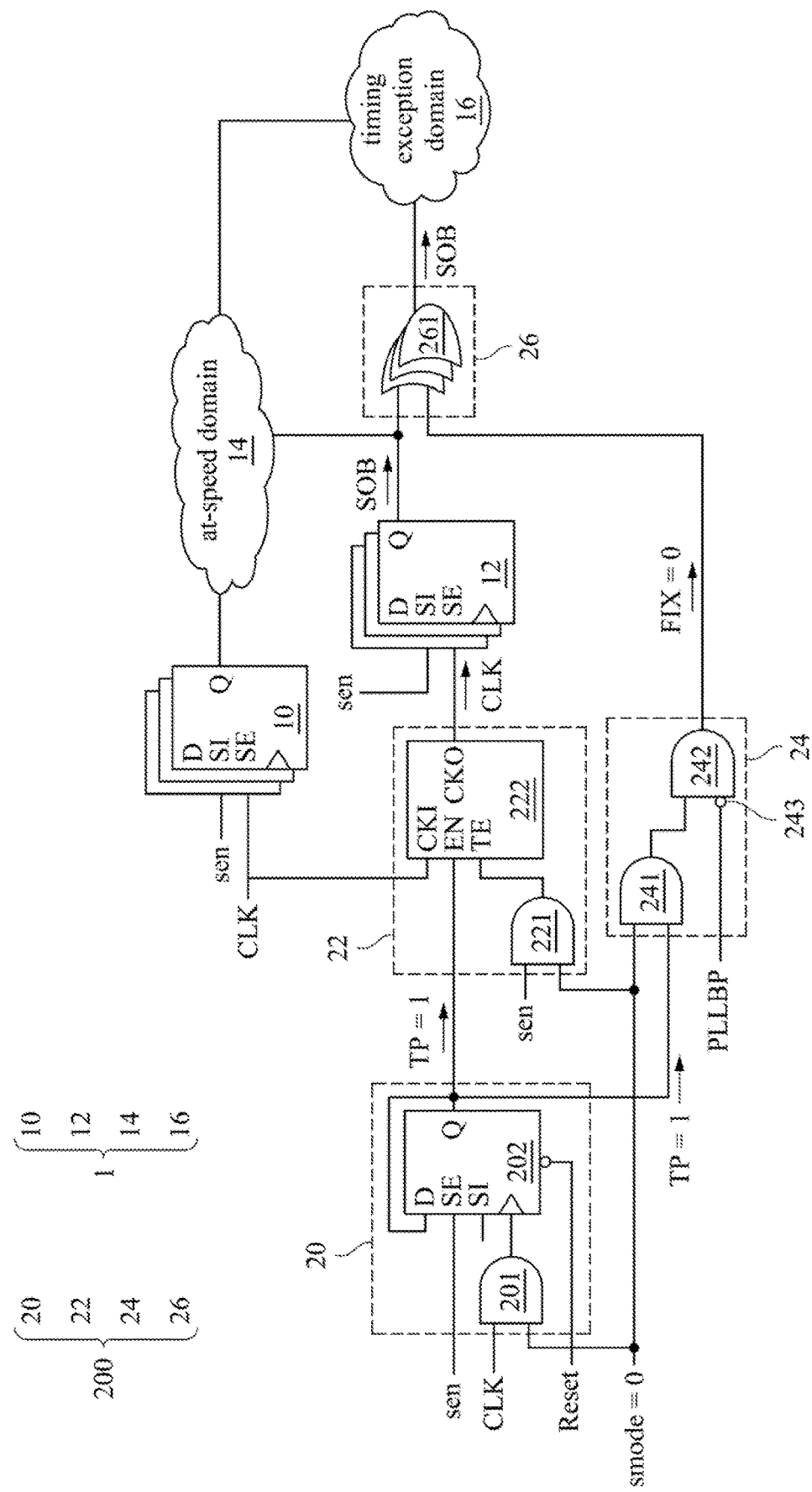
FIG. 7 is a schematic diagram of an operation of the clock control circuit when the circuitry is operated in a function mode in accordance with some embodiments of the present disclosure.

Referring to FIG. 7, FIG. 7 is a schematic diagram of an operation of the clock control circuit 200 when the circuitry 1 is operated in the function mode in accordance with some embodiments of the present disclosure. Please see the first gate control circuit 20 in FIG. 7. In the condition that the scan mode signal smode has the second logic value, the first gate control circuit 20 is controlled by the reset signal Reset to continuously output the first control signal TP having the first logic value.

Please see the first gate circuit 22 in FIG. 7. The logic circuit 221 outputs an output logic value which is the second logic value (e.g., logic 0) according to the scan mode signal smode having the second logic value. The switch circuit 222, in the condition that the output logic value received by the main enable terminal TE is the second logic value, provides the clock signal CLK to the clock input terminal of the scan flip-flop circuit 12 according to the first control signal TP having the first logic value received by the minor enable terminal EN. Since the first gate control circuit 20 continuously outputs the first control signal TP having the first logic value at this time, the first gate circuit 22 would continuously provide the clock signal CLK to the scan flip-flop circuit 12.

Please see the second gate control circuit 24 in FIG. 7. The logic circuit 241 outputs the second logic value (e.g., logic 0) to the logic circuit 242 according to the scan mode signal smode having the second logic value and the first control signal TP having the first logic value. Accordingly, the logic circuit 242 continuously outputs the second control signal FIX having the second logic value regardless of whether the logic circuit 243 outputs the first or second logic value.

Please see the second gate circuit 26 in FIG. 7. Since the second gate control circuit 24 continuously outputs the second control signal FIX having the second logic value, the logic circuit 261 is continuously operated as the short-circuited circuit, so as to allow the output signal SOB of the scan flip-flop circuit 12 to be transmitted to the timing exception domain 16. In such way, the clock control circuit 200 would not affect the operation of the circuitry 1 in the function mode.

It can be seen from the descriptions of FIG. 7 that the clock control method 400 can further includes at least two other steps in some embodiments. In a first one of said two other steps, when the circuitry 1 is operated in the function mode, the first gate control circuit 20 outputs the first control signal TP having the first logic value to the first gate circuit 22 according to the reset signal Reset. In a second one of said two other steps, when the circuitry 1 is operated in the function mode, the first gate circuit 22 provides the clock signal CLK to the scan flip-flop circuit 12 according to the first control signal TP having the first logic value.

As can be seen from the above embodiments of the present disclosure, by the clock control circuit 200 of the present disclosure, the at-speed domain 14 in the circuitry 1 can avoid receiving the unknown data values under the transition delay fault test. In such way, the amount of the test pattern for the circuitry 1 and the test time and cost of the circuitry 1 can all be dramatically reduced. In addition, the clock control circuit 200 of the present disclosure can also avoid affecting the operation of the circuitry 1 when the circuitry 1 is operated under the stuck-at fault test or operated in the function mode.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the invention. In view of the foregoing, it is intended that the present invention cover modifications and variations of this invention provided they fall within the scope of the following claims.

What is claimed is:

1. A clock control circuit, configured to control a circuitry, wherein the circuitry comprises a scan flip-flop circuit, an at-speed domain and a timing exception domain, the scan flip-flop circuit is configured to output data to the at-speed domain and the timing exception domain, and the clock control circuit comprises:
   a first gate control circuit, configured to output a first control signal;
   a first gate circuit, coupled between the first gate control circuit and the scan flip-flop circuit, and configured to be controlled by the first control signal, a scan enable signal and a scan mode signal to block or output a clock signal to the scan flip-flop circuit;
   a second gate control circuit, coupled to the first gate control circuit, and configured to be controlled by the first control signal, the scan mode signal and a test switch signal to determine a second control signal; and
   a second gate circuit, coupled to the scan flip-flop circuit, the second gate control circuit and the timing exception domain, configured to receive the second control signal and an output signal of the scan flip-flop circuit, and configured to be controlled by the second control signal to block or output the output signal to the timing exception domain.

2. The clock control circuit of claim 1, wherein the first gate circuit provides the clock signal to the scan flip-flop circuit in a condition that the first control signal has a first logic value and the scan mode signal has a second logic value different to the first logic value.

3. The clock control circuit of claim 1, wherein the first gate circuit provides the clock signal to the scan flip-flop circuit in a condition that the scan mode signal has a first logic value and the scan enable signal has the first logic value.

4. The clock control circuit of claim 1, wherein the first gate circuit blocks or outputs the clock signal to the scan flip-flop circuit according to a logic value of the first control signal in a condition that the scan mode signal has a first logic value and the scan enable signal has a second logic value different to the first logic value.

5. The clock control circuit of claim 1, wherein the first gate circuit comprises:
   a logic circuit, configured to receive the scan enable signal and the scan mode signal, and configured to output an output logic value according to the scan enable signal and the scan mode signal; and
   a switch circuit, coupled to the first gate control circuit, the logic circuit and a clock input terminal of the scan flip-flop circuit, configured to receive the clock signal, the output logic value and the first control signal, configured to output the clock signal in a condition that the output logic value is a first logic value, and configured to output or block the clock signal according to a logic value of the first control signal in a condition that the output logic value is a second logic value different to the first logic value.

6. The clock control circuit of claim 1, wherein the second gate circuit outputs a predetermined signal having a first logic value to the timing exception domain in a condition that the second control signal has the first logic value;
   wherein the second gate circuit provides the output signal to the timing exception domain in a condition that the second control signal has a second logic value different to the first logic value.

7. The clock control circuit of claim 1, wherein the second gate circuit comprises a logic circuit, a first input terminal of the logic circuit is coupled to a data output terminal of the scan flip-flop circuit and the at-speed domain, and is configured to receive the output signal, a second input terminal of the logic circuit is coupled to the second gate control circuit, and is configured to receive the second control signal, and an output terminal of the logic circuit is coupled to the timing exception domain.

8. The clock control circuit of claim 1, wherein the second gate control circuit, in a condition that the test switch signal has a first logic value, outputs the second control signal having a second logic value different to the first logic value;
   wherein the second gate control circuit outputs the second control signal having the second logic value in a condition that the scan mode signal has the second logic value;
   wherein the second gate control circuit outputs the second control signal having the first logic value or the second logic value according to a logic value of the first control signal in a condition that the test switch signal has the second logic value and the scan mode signal has the first logic value.

9. The clock control circuit of claim 1, wherein the second gate control circuit comprises:
   a first logic circuit, wherein a first input terminal of the first logic circuit is configured to receive the scan mode signal, and a second input terminal of the first logic circuit is coupled to the first gate control circuit, and is configured to receive the first control signal;
   a second logic circuit, wherein a first input terminal of the second logic circuit is coupled to an output terminal of the first logic circuit, and an output terminal of the second logic circuit is coupled to the second gate circuit; and
   a third logic circuit, wherein an input terminal of the third logic circuit is configured to receive the test switch signal, and an output terminal of the third logic circuit is coupled to a second input terminal of the second logic circuit.

10. The clock control circuit of claim 1, wherein the first gate control circuit is configured to receive the clock signal, the scan mode signal, the scan enable signal and a reset signal;
- wherein the first gate control circuit is configured to, in a condition that the scan mode signal has a first logic value, output the first control signal having the first logic value or a second logic value different to the first logic value according to a test pattern;
- wherein the first gate control circuit is configured to, in a condition that the scan mode signal has the second logic value, output the first control signal having the first logic value by the control of the reset signal.

11. The clock control circuit of claim 1, wherein the first gate control circuit comprises:
- a logic circuit, wherein a first input terminal of the logic circuit is configured to receive the clock signal, and a second input terminal of the logic circuit is configured to receive the scan mode signal; and
- a switch control circuit, configured to receive a reset signal and the scan enable signal, wherein a clock input terminal of the switch control circuit is coupled to an output terminal of the logic circuit, a data output terminal of the switch control circuit is coupled to the first gate circuit, the second gate control circuit and a first data input terminal of the switch control circuit, and a second data input terminal of the switch control circuit is coupled to a scan chain path of the circuitry;
- wherein the scan chain path comprises the scan flip-flop circuit.

12. A clock control method of a circuitry, wherein the circuitry comprises a scan flip-flop circuit, an at-speed domain and a timing exception domain, the scan flip-flop circuit is configured to output data to the at-speed domain and the timing exception domain, and the clock control method comprises:
- when the circuitry is operated in a capture phase of a scan test, by a first gate circuit coupled to a clock input terminal of the scan flip-flop circuit, providing a clock signal to the scan flip-flop circuit according to a first control signal having a first logic value; and
- when the circuitry is operated in the capture phase, by the first gate circuit, blocking the clock signal to the scan flip-flop circuit according to the first control signal having a second logic value different to the first logic value, wherein the logic value of the first control signal is determined by a test pattern for testing the circuitry.

13. The clock control method of claim 12, further comprising:
- when the circuitry is operated in the capture phase, by a second gate circuit coupled between a data output terminal of the scan flip-flop circuit and the timing exception domain, providing an output signal of the scan flip-flop circuit to the timing exception domain according to a second control signal having the second logic value.

14. The clock control method of claim 13, further comprising:
- when the circuitry is operated in the capture phase, by a second gate control circuit coupled to the second gate circuit, outputting the second control signal having the second logic value to the second gate circuit according to a test switch signal having the first logic value.

15. The clock control method of claim 13, further comprising:
- when the circuitry is operated in the capture phase, by a second gate control circuit coupled to the second gate circuit, outputting the second control signal having the second logic value to the second gate circuit according to the first control signal having the second logic value and a test switch signal having the second logic value.

16. The clock control method of claim 13, further comprising:
- when the circuitry is operated in the capture phase, by the second gate circuit, blocking the output signal of the scan flip-flop circuit to the timing exception domain according to the second control signal having the first logic value.

17. The clock control method of claim 16, further comprising:
- when the circuitry is operated in the capture phase, by a second gate control circuit coupled to the second gate circuit, outputting the second control signal having the first logic value to the second gate circuit according to the first control signal having the first logic value and a test switch signal having the second logic value.

18. The clock control method of claim 12, further comprising:
- when the circuitry is operated in a shift phase of the scan test, by the first gate circuit, providing the clock signal to the scan flip-flop circuit.

19. The clock control method of claim 12, further comprising:
- when the circuitry is operated in a function mode, by the first gate circuit, providing the clock signal to the scan flip-flop circuit according to the first control signal having the first logic value.

20. The clock control method of claim 19, further comprising:
- when the circuitry is operated in the function mode, by a first gate control circuit coupled to the first gate circuit, outputting the first control signal having the first logic value to the first gate circuit according to a reset signal.

* * * * *